United States Patent
Klein et al.

(10) Patent No.: US 6,583,652 B1
(45) Date of Patent: Jun. 24, 2003

(54) HIGHLY LINEAR PROGRAMMABLE TRANSCONDUCTOR WITH LARGE INPUT-SIGNAL RANGE

(75) Inventors: Hans W. Klein, San Jose, CA (US); Jian Li, Portland, OR (US); Paul Hildebrant, Banks, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/159,009

(22) Filed: May 30, 2002

Related U.S. Application Data (60) Provisional application No. 60/295,073, filed on Jun. 1, 2001.

(51) Int. Cl.[7] .......................... H03K 5/22; H02M 11/00
(52) U.S. Cl. .......................... 327/103; 327/65; 330/254
(58) Field of Search .......................... 327/103, 65, 77, 327/560–563, 52, 54, 67; 330/252, 254, 260

(56) References Cited

U.S. PATENT DOCUMENTS

| | | | |
|---|---|---|---|
| 4,250,556 A | 2/1981 | Goser | 364/600 |
| 4,462,003 A * | 7/1984 | Takamatsu | 330/254 |
| 4,698,800 A | 10/1987 | Cavaliere et al. | 327/103 |
| 5,068,823 A | 11/1991 | Robinson | 395/500 |
| 5,107,146 A | 4/1992 | El-Ayat | 307/465 |
| 5,196,740 A | 3/1993 | Austin | 307/303 |
| 5,311,142 A | 5/1994 | Terane et al. | 330/10 |
| 5,416,484 A | 5/1995 | Lofstrom | 341/159 |
| 5,463,349 A | 10/1995 | Petersen et al. | 330/254 |
| 5,510,738 A | 4/1996 | Gorecki et al. | 327/103 |
| 5,528,179 A | 6/1996 | Siniscalchi et al. | 327/103 |
| 5,554,957 A | 9/1996 | Klein | 330/251 |
| 5,557,234 A | 9/1996 | Collins | 327/563 |
| 5,574,678 A | 11/1996 | Gorecki | 364/807 |
| 5,631,606 A | 5/1997 | Tran | 330/253 |
| 5,680,070 A | 10/1997 | Anderson et al. | 327/336 |
| 5,726,604 A * | 3/1998 | Onetti et al. | 330/283 |
| 5,821,776 A | 10/1998 | McGowan | 326/41 |
| 5,877,536 A | 3/1999 | Inaba | 256/379 |
| 5,877,612 A | 3/1999 | Straw | 330/254 |
| 5,912,567 A | 6/1999 | Drost et al. | 327/89 |
| 5,912,583 A | 6/1999 | Pierson et al. | 327/553 |

(List continued on next page.)

FOREIGN PATENT DOCUMENTS

| | | |
|---|---|---|
| EP | 0322382 B1 | 9/1994 |
| EP | 0871223 A1 | 10/1998 |
| EP | 0611165 B1 | 7/1999 |

OTHER PUBLICATIONS

Edward K. F. Lee and P. G. Gulak, "Prototype Design of a Field Programmable Analog Array," Aug. 30, 1990, pp. 2.2.1–2.2.8.

Edward K. F. Lee and P. Glenn Gulak, "A CMOS Field–Programmable Analog Array," *Lee Journal Of Solid–State Circuits*, vol. 26, No. 12, Dec. 1991, pp. 1860–1867.

Lattice Semiconductor Corporation, "isPAC®10 Gain Stages And Attenuation Methods," Sep. 1999, pp. 1–5.

*Primary Examiner*—Toan Tran
(74) *Attorney, Agent, or Firm*—Campbell Stephenson Ascolese LLP; Marc R. Ascolese (57) ABSTRACT

An improved programmable transconductor can be efficiently implemented utilizing a programmable resistor circuit that allows for only a selected portion of the resistor circuit (associated with a desired transconductor gain) to be coupled between summing nodes of the transconductor. Additional switching circuits can be used to reduce gain errors associated with the switches used to implement the aforementioned solution. Additionally, the improved programmable transconductor can be integrated into fully differential programmable analog integrated circuits, thereby enhancing the performance of such integrated circuits.

45 Claims, 7 Drawing Sheets

U.S. PATENT DOCUMENTS

| | | |
|---|---|---|
| 5,952,867 A | 9/1999 | Choi .......................... 327/346 |
| 5,959,871 A | 9/1999 | Pierzchala et al. .......... 364/489 |
| 5,966,047 A | 10/1999 | Anderson et al. ........... 327/565 |
| 5,994,926 A | 11/1999 | Siniscalchi et al. ........... 327/65 |
| 6,014,097 A | 1/2000 | Brandt ....................... 341/156 |
| 6,043,709 A | 3/2000 | Shin ........................... 330/253 |
| 6,046,875 A * | 4/2000 | Siniscalchi et al. ......... 327/103 |
| 6,111,437 A | 8/2000 | Patel ........................... 327/74 |
| 6,118,266 A | 9/2000 | Manohar et al. ............. 323/316 |
| 6,140,867 A | 10/2000 | de Micheli et al. ......... 327/553 |
| 6,201,429 B1 | 3/2001 | Rosenthal .................... 327/333 |
| 6,509,796 B2 * | 1/2003 | Nguyen et al. .............. 330/254 |

* cited by examiner

HIGHLY LINEAR PROGRAMMABLE TRANSCONDUCTOR WITH LARGE INPUT-SIGNAL RANGE

This application claims the benefit of U.S. Provisional Application No. 60/295,073, filed Jun. 1, 2001, entitled "Highly Linear Programmable Transconductor With Large Input-Signal Range," and naming Hans W. Klein, Jian Li, and Paul Hildebrandt as inventors. The above-referenced provisional application is hereby incorporated by reference herein in its entirety.

BACKGROUND

1. Technical Field

This invention relates to analog circuits for converting an input voltage into an output current, and more particularly to programmable analog circuits for converting an input voltage into an output current.

2. Description of the Related Art

A transconductor is a circuit which receives an input voltage and generates an output current. The magnitude of the output current is proportional to the input voltage received, and the ratio by which the output current changes. The ratio of output current change to input voltage change is known as the conversion gain, or transconductance ($G_m = \Delta I_{OUT}/\Delta V_{IN}$) of the transconductor. A differential transconductor receives a differential voltage impressed between two voltage input terminals, and generates a differential current between two current output terminals. The common-mode voltage of the two voltage input terminals is ignored.

Figure 1:
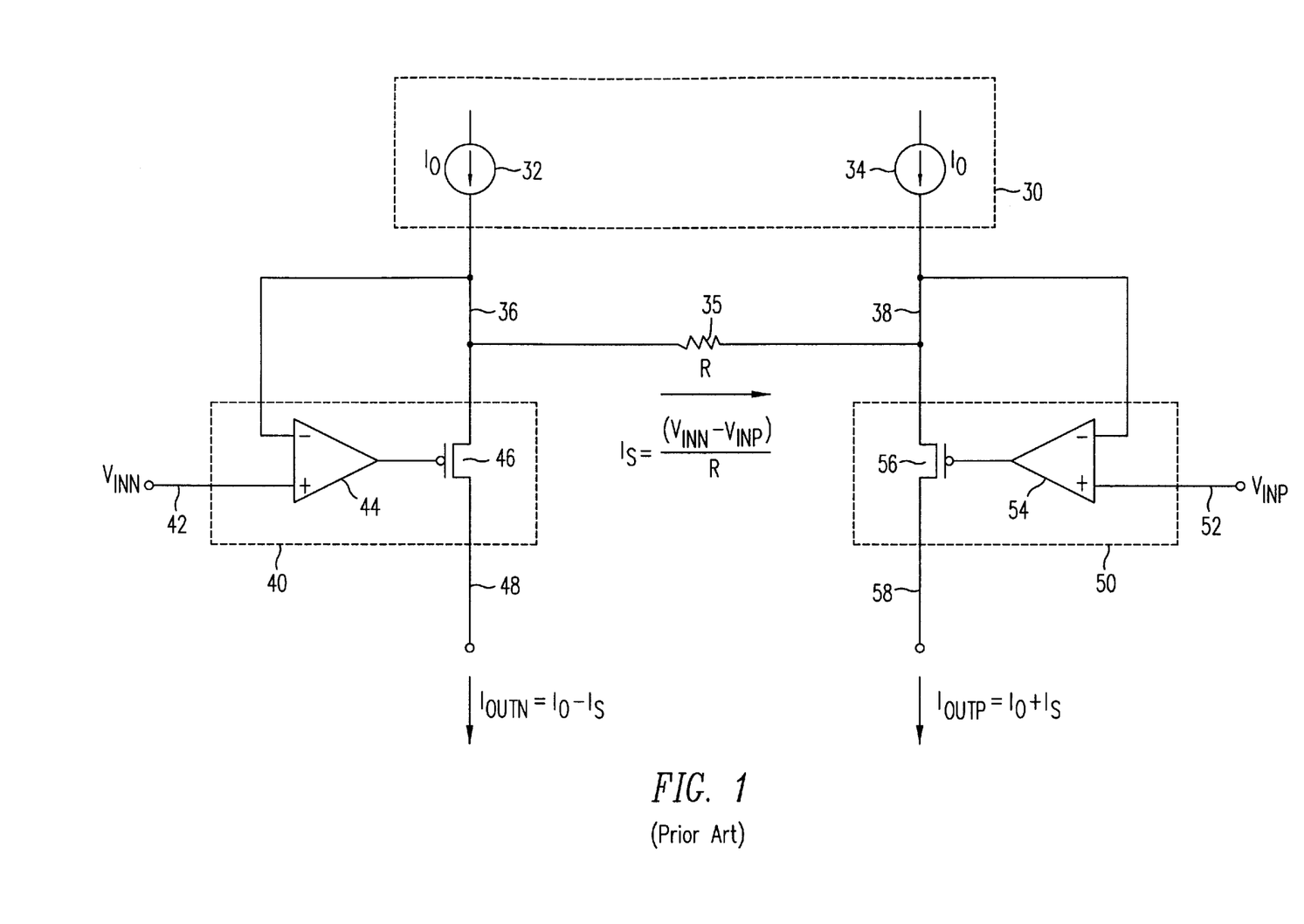
FIG. 1 is a schematic diagram of a prior art differential transconductor.

A typical prior art differential transconductor art is shown in FIG. 1. A differential input voltage, $V_{INN}-V_{INP}$, is received between voltage input terminals 42 and 52, and a corresponding differential output current is generated between current output terminals 48 and 58. Current source circuit 30 includes current source 32 which delivers a current of magnitude $I_0$ into summing node 36 and current source 34 which delivers a current of magnitude $I_0$ into summing node 38. Input circuit 40, includes a gain block (e.g., operational amplifier (op-amp) 44) having a non-inverting input coupled to the voltage input terminal 42 and an inverting input coupled to the summing node 36. The output of op-amp 44 drives the gate of transistor 46, which is a p-channel MOS transistor. Transistor 46 couples summing node 36 to current output terminal 48. Similarly, a second input circuit 50, includes an op-amp 54 having a non-inverting input coupled to voltage input terminal 52 and an inverting input coupled to summing node 38. The output of op-amp 54 drives the gate of transistor 56, which is also a p-channel MOS transistor. Transistor 56 couples summing node 38 to current output terminal 58. Resistor 35 (having the value R) couples summing node 36 to summing node 38. As is common with differential circuits, current source 32 and input circuit 40 are matched to current source 34 and input circuit 50, respectively, to provide balanced differential operation.

The operation of this circuit can best be understood by looking initially at the left-most portion. Input circuit 40 functions to force the voltage of summing node 36 to follow input voltage, $V_{INN}$, received on voltage input terminal 42. This occurs because op-amp 44 drives the gate of transistor 46 to a suitable voltage such that the voltage of summing node 36, which is coupled to the inverting input of op-amp 44, follows the input voltage, $V_{INN}$, coupled to the non-inverting input of op-amp 44. For example, if the voltage of summing node 36 is too high, the output of op-amp 44 is driven lower, thus providing corrective gate drive to p-channel MOS transistor 46. Consequently, a higher current flows through transistor 46 which lowers the voltage of summing node 36 until the voltage at summing node 36 is equal (or substantially equal) to the voltage at non-inverting input terminal of op-amp 44. The right-most portion of the transconductor of FIG. 1 operates in a similar fashion.

Thus, with the voltage of summing node 36 following input voltage $V_{INN}$ and the voltage of summing node 38 following input voltage $V_{INP}$, the differential input voltage $V_{INN}-V_{INP}$ is placed across resistor 35, and causes a current $I_S$ of magnitude $(V_{INN}-V_{INP})/R$ to flow from summing node 36 to summing node 38. If $V_{INP}$ is greater in magnitude than $V_{INN}$ then a negative current $I_S$ flows from summing node 36 to summing node 38 which is equivalent to a positive current flow from summing node 38 to summing node 36.

Summing node 36 receives a current Io from current source 32, and sources a current $I_S$ flowing into summing node 38. Thus, the net current which is provided to the source of transistor 46 is $I_0-I_S$. The current, $I_{OUTN}$, coupled to current output terminal 48 must also be equal to $I_0-I_S$ because the sum of currents received into any node must equal zero. Similarly, summing node 38 receives current 10 from current source 34, and receives a current $I_S$ flowing from summing node 36. The net current received into summing node 38 is $I_0+I_S$, which is coupled by transistor 56 to the current output terminal 58 as $I_{OUTP}=I_0+I_S$.

The topology of the circuit in FIG. 1 is generally known as a degenerated pair linearized by servo-feedback, or a linearized resistor-based transconductor. The use of a resistor in setting the conversion gain of the transconductor generally results in high linearity, but also results in a conversion gain which is fixed by the choice of resistor value, and which varies with semiconductor process parameter variations. Consequently, programmable transconductors have been developed to allow selecting of the desired conversion gain after semiconductor manufacturing by, for example, a programmable resistor circuit.

An example of such a programmable transconductor can be found in U.S. Pat. No. 5,510,738, entitled "CMOS Programmable Resistor-Based Transconductor," by James L. Gorecki and Yaohua Yang, (the "'738 patent") which is incorporated herein by reference in its entirety.

Figure 2:
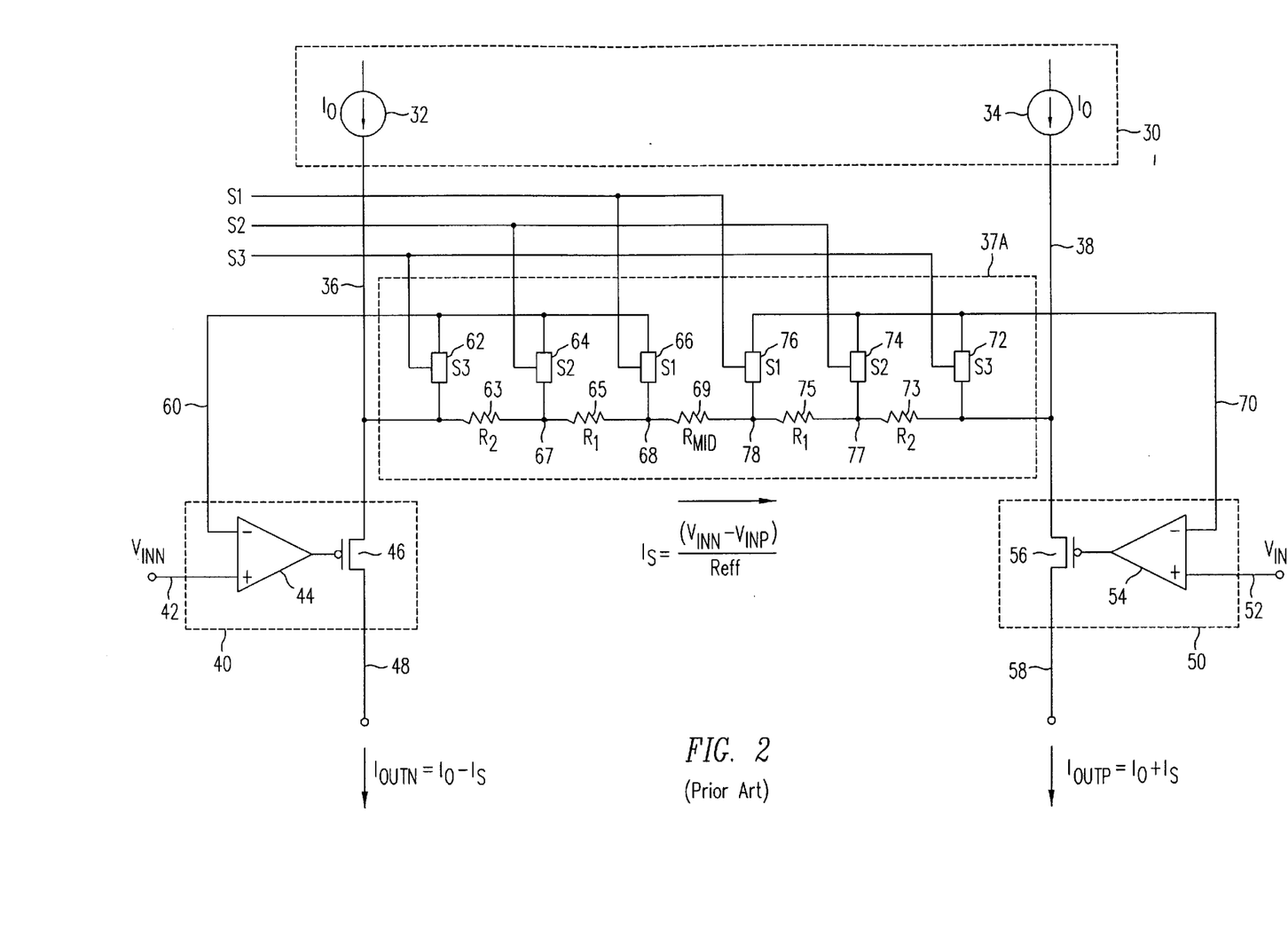
FIG. 2 is a schematic diagram of a prior art programmable differential transconductor.

FIG. 2 shows a programmable transconductor such as those disclosed in the '738 patent. In many aspects, the programmable transconductor of FIG. 2 is similar to the transconductor of FIG. 1. Input circuit 40 includes an op-amp 44 (functioning as a gain block) having a non-inverting input coupled to voltage input terminal 42 and an inverting input coupled to first feedback node 60. The output of op-amp 44 drives the gate of transistor 46, which couples summing node 36 to current output terminal 48. Similarly, input circuit 50 includes op-amp 54 having a non-inverting input coupled to voltage input terminal 52 and an inverting input coupled to a feedback node 70. The output of op-amp 54 drives the gate of transistor 56, which couples summing node 38 to the current output terminal 58.

In further contrast to the transconductor of FIG. 1, the programmable transconductor of FIG. 2 includes circuit 37A having an array of switch circuits (62, 64, 66, 72, 74, and 76) and including a resistor circuit having a total resistance of R coupling summing node 36 to summing node 38. The resistor circuit includes resistors 63, 65, 69, 75, and 73 connected in series and defining a group of intermediate nodes 67, 68, 78, and 77 respectively therebetween. These intermediate nodes, together with summing nodes 36 and 38, form a group of tap nodes of the resistor circuit.

Switch circuits 62, 64, and 66 couple summing node 36 to feedback node 60 when enabled by logical signals S3, S2, and S1, respectively. Switch circuits 72, 74, and 76 couple summing node 38 to feedback node 70 when enabled by logical signals S3, S2, and S1, respectively. Logical signals S1, S2, and S3 are preferably digital control signals which select the desired transconductance of the circuit, but may also be a hardwired or some other fixed connection.

In operation, the programmable transconductor of FIG. 2 can be understood by assuming (for example) that logical signal S2 is active, and thus switch circuits 64 and 74 are enabled and remaining switch circuits 62, 66, 72, and 76 are disabled. Since intermediate node 67 is coupled to feedback node 60 which is coupled to the inverting input of op-amp 44, input circuit 40 functions to force the voltage of feedback node 60 and intermediate node 67 to follow the voltage $V_{INN}$, received on voltage input terminal 42. If $V_{INN}$ is greater than $V_{INP}$, and thus $I_S$ is positive, op-amp 44 drives the gate of transistor 46 to a suitable voltage such that the voltage of summing node 36 is driven to a voltage higher than $V_{INN}$, so that the voltage of feedback node 60, which is coupled to the inverting input of op-amp 44, follows the input voltage $V_{INN}$.

Input circuit 50 functions to force the voltage of intermediate node 77 to follow the voltage, $V_{INP}$, received on voltage input terminal 52. Thus, with feedback node 60 following input voltage $V_{INN}$ and feedback node 70 following input voltage $V_{INP}$, and since no DC current flows through switch circuits 64 and 74 (due to the high input impedance of op-amps 44 and 54), the differential input voltage $V_{INN}-V_{INP}$ is placed directly across an effective resistance, $R_{eff}$, consisting of resistors 65, 69, and 75 (since for this discussion logical signal S2 is active). This causes a current $I_S$ of magnitude $(V_{INN}-V_{INP})/R_{eff}$ to flow from summing node 36 to summing node 38. If $V_{INP}$ is greater in magnitude than $V_{INN}$ then a negative current $I_S$ flows from summing node 36 to summing node 38 which is equivalent to a positive current flow from summing node 38 to summing node 36.

However, it can be seen from FIG. 2 that even though the magnitude of the current $I_S$ is set by the input differential voltage $V_{INN}-V_{INP}$ across the effective resistor, $R_{eff}$, formed by those resistors connected between the selected tap nodes, the current $I_S$ flows through all the series-connected resistors connected between summing nodes 36 and 38. Because $I_S$ $(V_{INN}-V_{INP})/R_{eff}$, higher conversion gain is accomplished by smaller values of effective resistance. By programming the switch circuits of circuit 37A, the conversion gain can be changed. Consequently, the voltage across the full resistor circuit increases as the gain increases. In other words, if tap points are selected that achieve a gain of 2, the total voltage drop across the entire resistor circuit also increases by a factor of 2. Because the total available voltage swing across the resistor circuit is limited by various operating conditions (e.g., supply voltage, input common-mode voltage, the threshold voltage of PMOS and other devices, etc) it is desirable to avoid large voltage swings across the resistor circuit. On the other hand, it is also desirable to achieve large gain. Thus, as gain increases, it becomes increasingly difficult to establish a large voltage across the resistor circuit for the practical limitations previously stated.

Accordingly, it is desirable to have a programmable transconductor that maintains a variety of programmable gain levels and high gain accuracy while still allowing large input signal and common-mode ranges.

SUMMARY

It has been discovered that an improved programmable transconductor can be efficiently implemented utilizing a programmable resistor circuit that allows for only a selected portion of the resistor circuit (associated with a desired transconductor gain) to be coupled between summing nodes of the transconductor. Additional switching circuits can be used to reduce gain errors associated with the switches used to implement the aforementioned solution. Additionally, the improved programmable transconductor can be integrated into fully differential programmable analog integrated circuits, thereby enhancing the performance of such integrated circuits.

Accordingly, one aspect of the present invention provides a programmable transconductor for generating a differential current between first and second current output terminals responsive to a differential voltage applied between first and second voltage input terminals. The programmable transconductor includes first and second summing nodes, and first and second feedback nodes. The programmable transconductor also includes a resistor circuit including a plurality of resistors connected in series and defining a plurality of intermediate nodes, respective ones of the plurality of intermediate nodes being located between adjacent resistors of the plurality of resistors. The programmable transconductor is configured to selectively couple at least one of the plurality of resistors between the first summing node and the second summing node and to leave remaining ones of the plurality of resistors uncoupled from the first summing node and the second summing node. A switch circuit is coupled between a first one of the plurality of intermediate nodes and one of: the first summing node and the second summing node. A first input circuit is coupled to the first summing node and the first voltage input terminal. The first input circuit biases the first summing node to a suitable voltage so as to bias the first feedback node to a voltage substantially equal to a voltage applied to the first voltage input terminal. A second input circuit is coupled to the second summing node and the second voltage input terminal. The second input circuit biases the second summing node to a suitable voltage so as to bias the second feedback node to a voltage substantially equal to a voltage applied to the second voltage input terminal.

Another aspect of the present invention provides a programmable analog integrated circuit for receiving a differential analog input signal and providing a processed differential analog output signal, the programmable analog circuit. The programmable analog integrated circuit includes a first programmable analog circuit block having first analog circuit block positive and negative input terminals, first analog circuit block positive and negative output terminals, and the programmable transconductor of the present invention. The programmable analog integrated circuit also includes an analog routing pool. The analog routing pool controls the routing of the differential analog input signal and signals provided by and to the first programmable analog circuit block. The analog routing pool is programmable.

Yet another aspect of the present invention provides a programmable transconductor for generating a differential current between first and second current output terminals responsive to a differential voltage applied between first and second voltage input terminals. The programmable transconductor includes first and second summing nodes, and first and second feedback nodes. A current source circuit is configured to deliver a current to each of the first summing node and the second summing node. The programmable transconductor also includes a resistor circuit including a plurality of resistors connected in series and defining a plurality of intermediate nodes, respective ones of the plurality of intermediate nodes being located between adjacent resistors of the plurality of resistors. The programmable transconductor is configured to selectively couple at least one of the plurality of resistors between the first summing node and the second summing node and to leave remaining ones of the plurality of resistors uncoupled from the first summing node and the second summing node. A first plurality of switch circuits is included, each having a first terminal coupled to a corresponding intermediate node of the resistor circuit, and each further having a second terminal coupled to the first summing node. A second plurality of switch circuits is included, each having a first terminal coupled to a corresponding intermediate node of the resistor circuit, and each further having a second terminal coupled to the second summing node. A third plurality of switch circuits is included, each having a first terminal coupled to a corresponding intermediate node of the resistor circuit, and each further having a second terminal coupled to the first feedback node. A fourth plurality of switch circuits is included, each having a first terminal coupled to a corresponding intermediate node of the resistor circuit, and each further having a second terminal coupled to the second feedback node. A first gain block includes a first input coupled to the first voltage input terminal, a second input coupled to the first feedback node, and an output. A first transistor includes a first current-handling terminal coupled to the first summing node, a second current-handling terminal coupled to the first current output terminal, and a control terminal coupled to the output of the first gain block. A second gain block includes a first input coupled to the second voltage input terminal, a second input coupled to the second feedback node, and an output. A second transistor includes a first current-handling terminal coupled to the second summing node, a second current-handling terminal coupled to the second current output terminal, and a control terminal coupled to the output of the second gain block.

The foregoing is a summary and this contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein can be implemented in a number of ways, and such changes and modifications can be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of the best contemplated mode for carrying out the invention. The description is intended to be illustrative of the invention and should not be taken to be limiting.

Figure 3A:
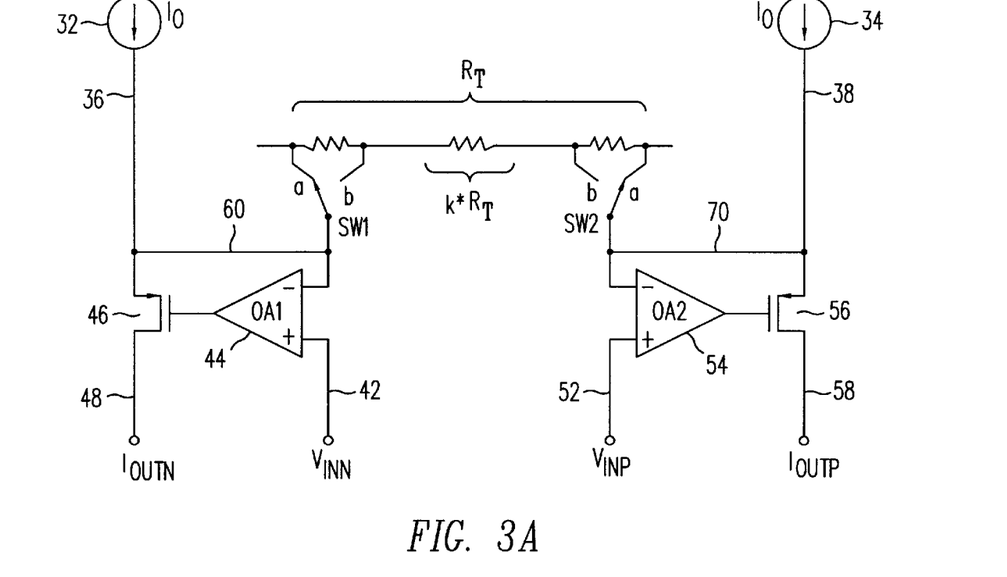
FIG. 3A is a simplified schematic diagram of an improved programmable differential transconductor.

FIG. 3A illustrates a simplified schematic diagram of an improved programmable differential transconductor. The entire resistor circuit (here represented by the symbol RT) is no longer directly connected between summing nodes 36 and 38. Thus, the feedback lines, the current sources, and the p-channel MOSFET source terminals are programmably connected to a variety of tap points, as illustrated by two-position switches SW1 and SW2. This design achieves large signal gains without increased signal swings across the resistor circuit $R_T$. Although resistor circuit $R_T$ is still in the current path, as in the programmable transconductor implementation of FIG. 2. However, when switching from the large value of $R_T$ to a smaller value (e.g., some fraction of the total resistance $R_T$) by bringing switches SW1 and SW2 from position a to position b, current no longer flows through the entire resistor, but only through the smaller section $k*R_T$. One advantage of this approach is that even though the output current is higher (by factor 1/k), the voltage across the entire resistor circuit $R_T$ is no longer amplified, as is the case with the programmable transconductor of FIG. 2. Thus, regardless of the tap position selected, the voltage across that section of the resistor is always equal to the input voltages. Consequently, the maximum possible input voltage can be operated on, regardless of gain, as long as the current sources 32 and 34 provide enough current to maintain circuit operation.

Figure 3B:
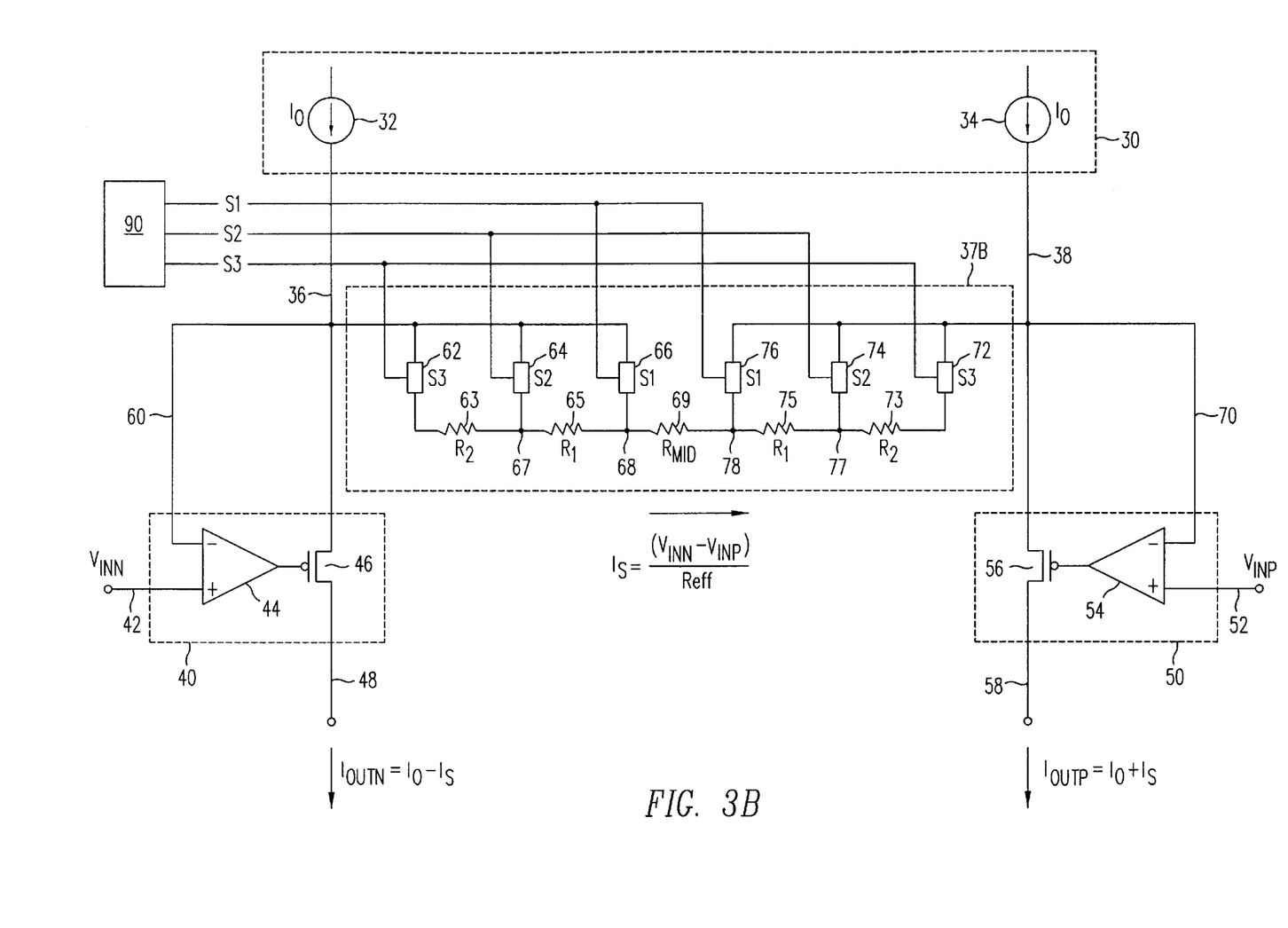
FIG. 3B is a schematic diagram of one implementation of the improved programmable differential transconductor of FIG. 3A.

Those having ordinary skill in the art will readily recognize that the programmable transconductor of FIG. 3A can be implemented using a variety of techniques and circuits. FIG. 3B shows one example of an implementation of the programmable transconductor of FIG. 3A. Circuit 37B has an array of switch circuits (62, 64, 66, 72, 74, and 76) and includes a resistor circuit having a total resistance of R. The switch circuits 62, 64, 66, 72, 74, and 76 selectively couple the nodes on either side of resistors 63, 65, 69, 75, and 73 (e.g., intermediate nodes 67, 68, 78, and 77, as well as the end nodes (not labeled)) between summing node 36 and summing node 38. Consequently, selected resistors can be coupled between nodes 36 and 38, while other resistors are uncoupled between the same nodes. As illustrated in FIG. 3B, summing nodes 36 and 38 are coupled to (i.e., are the same as) feedback nodes 60 and 70, respectively.

Additionally, current source circuit 30 can be advantageously implemented in a number of different ways. Identically biased MOS transistors may be used to achieve the current sources 32 and 34, for example, as in a current mirror configuration. Cascode devices can optionally be used to raise the output impedance of such current sources.

For any of these embodiments, op-amps 44 and 54 can be implemented in a variety of technologies and topologies, and the particular implementation is not pertinent to the operation of the transconductor. For example, CMOS folded cascode circuits and CMOS two-stage amplifier circuits may be used, as well as bipolar implementations or BiCMOS implementations. As long as the input impedance relatively high, e.g., <$10^8$ ohms, the implementation details of the op-amps are not significant to the programmability aspect of the transconductor circuit.

A variety of input circuit configurations can also be utilized with the present invention. The role of transistors 46 and 56 can be advantageously provided by either n-channel or p-channel MOS transistors or by NPN or PNP bipolar transistors, with a corresponding reversal of summing nodes and output current nodes.

The programmable topology illustrated in FIG. 3B is achieved by using a string of series-connected resistors, with a group of switch circuits to selectively "tap off" two nodes from the string, and to feedback these nodes to the inverting inputs of the op-amps 44 and 54, respectively. In a preferred embodiment, the selected nodes are symmetrically displaced around resistor 69. By changing the taps, the value of the effective resistor $R_{eff}$ is varied, with a resultant change in the transconductance $G_m$ (which varies as $1/R_{eff}$). Individual switch circuits are enabled by control signals which can be provided based upon information stored in internal or external memory. For example, switch circuits 62, 64, 66, 72, 74, and 76 are controlled by control signals supplied by memory 90. Memory 90 can be implemented using both nonvolatile and volatile memories, such as static read only memory, dynamic random access memory, static random addressable memory, shift registers, electronically erasable ($E^2$) memory, and flash memory.

As the circuit of FIG. 3B is a balanced differential circuit, it is preferred that the left-hand and right-hand resistors associated with each tap (e.g., resistors 65 and 75 being associated with enable signal S2 which enables switch circuits 64 and 74, respectively) have the same value, i.e., are balanced. The number of taps within the resistor string is not fundamentally limited, although for high frequency operation the parasitic capacitances associated with MOS switches or resistors may degrade performance. The resistors can be sized to produce any monotonic function, and can be numerically weighted (e.g., binarily weighted or non-linearly weighted). The resistors are preferably implemented as either thin film or polysilicon resistors when in an integrated circuit implementation. An additional example of the type of resistor circuit preferably used can be found in connection with FIG. 4 of the aforementioned '738 patent.

When implementing the circuits of FIGS. 3A and 3B, one should recognize that switches SW1 and SW2 (or switch circuits 62, 64, 66, 72, 74, and 76) used to disconnect from one tap point and reconnect to another, are not ideal. Instead, the switches can exhibit "on-resistance" which should be taken into consideration. The on-resistance typically involves both channel and contact resistances. Additionally, the channel resistance can change in a non-linear manner with signal level, temperature, and supply voltage. The circuits of FIGS. 3A and 3B are susceptible to this on-resistance because the signal current flows not only through the selected portion of $R_T$ (or the resistor circuit), but also through the switch(es) in that path. Hence the output current of FIG. 3A is now $dV/(k*R_T+2*R_{ON})$, where $R_{ON}$ is the on-resistance of one switch. Even a small contribution by the on-resistance can cause a gain error of several percent. Compensating for the switches on-resistance by slightly reducing the value of $R_T$ and its tap points is often not a practical solution since, in an integrated circuit, the resistor and the on-resistance of the switch are typically based on different semiconductor manufacturing process steps which can vary independently. Additionally, the resistance of the switches generally varies with the input signal which results in signal distortion, another undesirable effect.

Figure 4A:
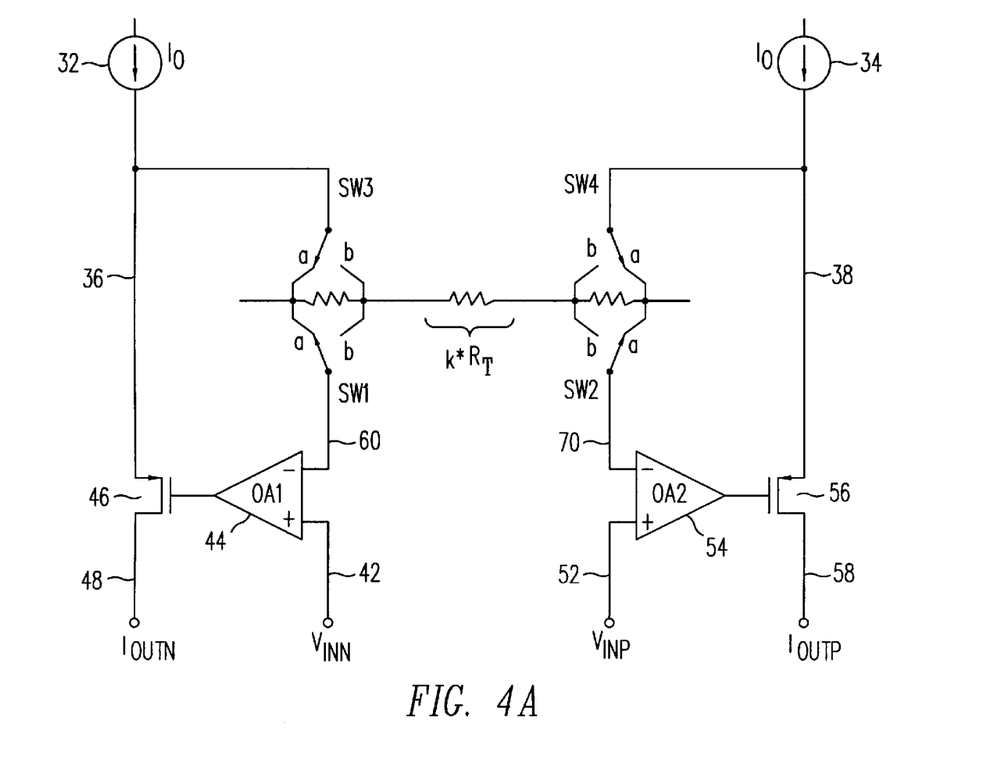
FIG. 4A is a simplified schematic diagram of a further improved programmable differential transconductor.

Gain errors introduced by the designs of FIGS. 3A and 3B can be avoided by introducing a second technique, whereby the feedback lines are switched using a zero-current technique. The second technique is illustrated in FIG. 4A combined with the basic design of FIG. 3A. A second set of switches SW3 and SW4 is introduced to allow the resistors or the resistor circuit to be selectively coupled into the summing path, while the original switches SW1 and SW2 are used to selectively couple the resistors of the resistor circuit into the feedback paths. Thus, summing nodes 36 and 38 are uncoupled from feedback nodes 60 and 70, respectively. The current through the selected resistor portion now flows through switches SW3 and SW4, which are still non-ideal and hence exhibit on-resistance. However, the feedback paths of the op-amps (which carry no current) have their own switches SW1 and SW2 allowing them to tap just into the portion of the resistor that is responsible for setting the gain. The input voltages are now accurately regenerated across the selected portion of the resistor, regardless of on-resistance of the switches.

Figure 4B:
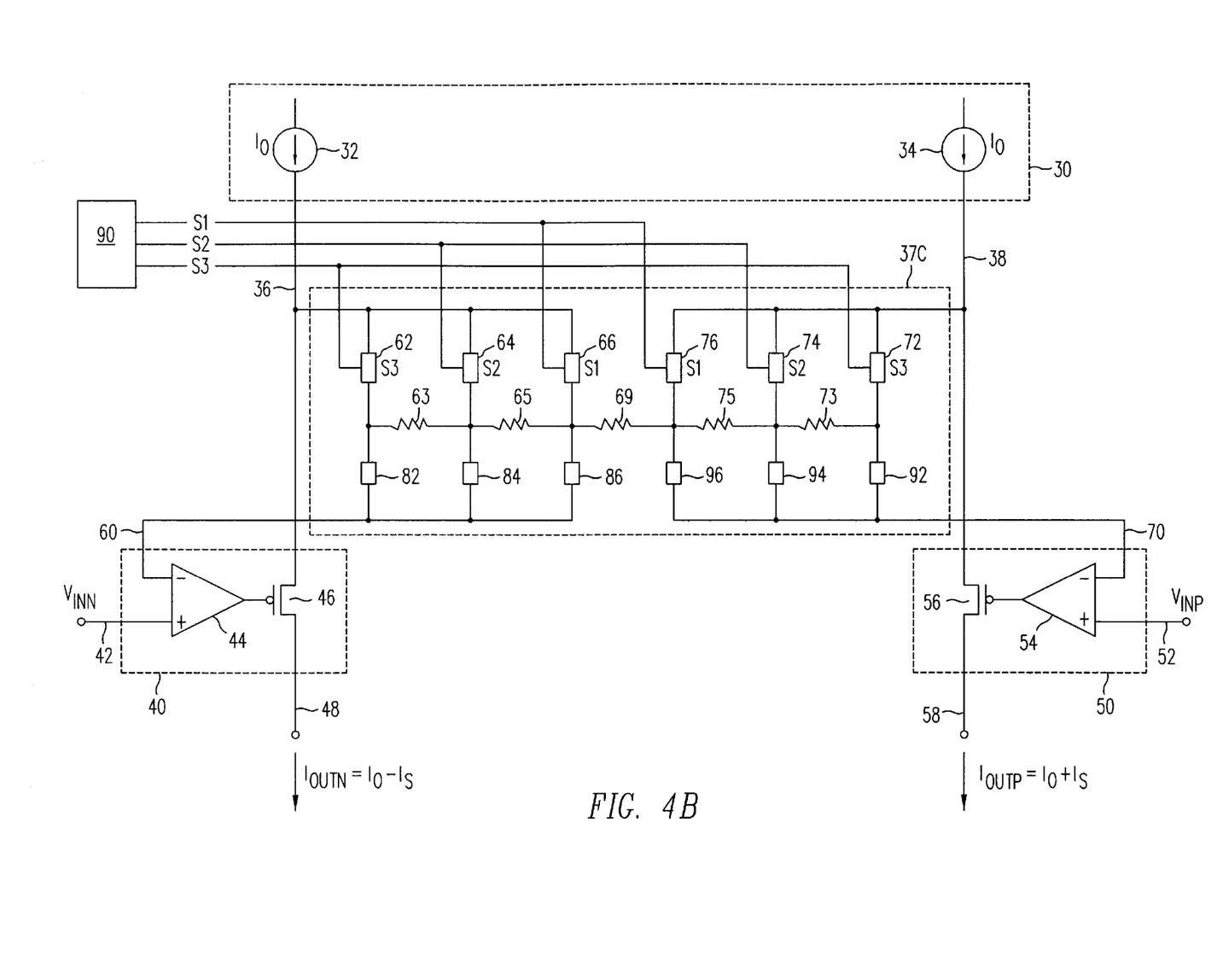
FIG. 4B is a schematic diagram of one implementation of the further improved programmable differential transconductor of FIG. 4A.

Those having ordinary skill in the art will readily recognize that the programmable transconductor of FIG. 4A can be implemented using a variety of techniques and circuits. FIG. 4B shows one example of an implementation of the programmable transconductor of FIG. 4A. Circuit 37C has an array of switch circuits (62, 64, 66, 72, 74, 76, 82, 84, 86, 92, 94, and 96) and includes a resistor circuit having a total resistance of R. As in FIG. 3B, the switch circuits 62, 64, 66, 72, 74, and 76 selectively couple the nodes on either side of resistors 63, 65, 69, 75, and 73 (e.g., intermediate nodes 67, 68, 78, and 77, as well as the end nodes (not labeled)) between summing node 36 and summing node 38. Switch circuits 82, 84, 86, 92, 94, and 96 selectively couple the nodes on either side of the resistors between feedback node 60 and feedback node 70. Consequently, selected resistors can be coupled between nodes 36 and 38, and nodes 60 and 70 while other resistors are uncoupled between the same nodes.

Although not shown, switch circuits 82, 84, 86, 92, 94, and 96 are supplied control signals in much the same way as switch circuits 62, 64, 66, 72, 74, and 76. Thus, the control signals can be hardwired, and or supplied by an internal or external memory such as memory 90. Additionally, each of the switch circuits can be independently controlled, controlled in pairs as illustrated in FIG. 3B, controlled in quads (e.g., switch circuits 62, 72, 82, and 92 controlled by the same signal such that they are switched "on" or "off" together), or using some combination of these techniques.

Figure 5:
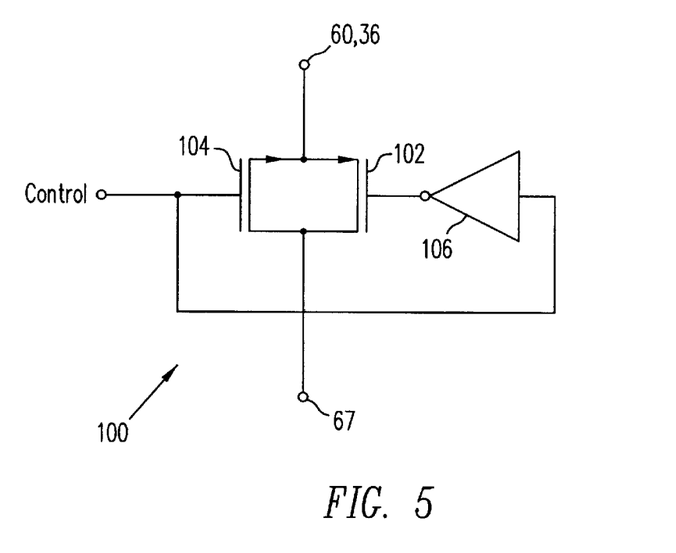
FIG. 5 is a schematic diagram of a switch circuit for use with a programmable differential transconductor.

Referring to FIG. 5, an example of a switch circuit 100, such as switch circuits switch circuits 62, 64, 66, 72, 74, 76, 82, 84, 86, 92, 94, and 96, is illustrated. Switch circuit 100 includes p-channel MOSFET 102 and n-channel MOSFET 104 as well as inverter 106 which generates the complement of the switch circuit's enable signal, e.g., one of the signals S1, S2, and S3. MOSFETs 102 and 104 can be referred to as a complementary CMOS switch and also as a CMOS transfer gate. The sources and drains of the transistors are connected between nodes (e.g., nodes 36/60 and 67 as in the case of switch circuit 64 of FIG. 3B. The gates of each of transistors 102 and 104 are coupled to complementary control signals which control whether the switch should be turned "on", in which case the resistance of the switch is low, e.g., <1000 ohms, or turned "off", in which case the resistance of the switch is high, e.g., $10^6$ ohms, i.e., the switch effectively functions as an open circuit. Those having ordinary skill in the art will readily recognize that a variety of different switch designs can be used to implement the switch circuits described.

The programmable transconductors described above are particularly suited for use in programmable analog integrated circuits. An analog integrated circuit with a programmable analog circuit block architecture permits change in a function of the analog circuit without changing the topology of the circuit elements, thereby reducing changes in voltage offset and distortion created by changes in topology. Examples of such analog integrated circuit architectures can be found in U.S. Pat. No. 5,574,678, entitled "Continuous Time Programmable Analog Block Architecture," by James L. Gorecki, (the "'678 patent") which is incorporated herein by reference in its entirety.

Programmable analog integrated circuits such as those disclosed in the '678 patent, typically include analog circuit blocks interconnected by a programmable interconnect structure and provide a self contained integrated circuit architecture which supports basic analog signal processing functions. The analog circuit blocks include basic circuit elements such as operational amplifiers, resistors, and capacitors, which can be programmably connected in a variety of circuit configurations. Users can define the functionality of individual blocks, control their respective characteristics, and interconnect blocks to define an overall architecture. Integrating the elements together in a single integrated circuit has a number of advantages. Critical circuit specifications such as dynamic range and common mode rejection can be more easily controlled, helping to make circuit performance more predictable and reliable. The input and output characteristics of the programmable analog circuit block allow the block to be used within an analog routing pool with other programmable analog circuit blocks to provide more complicated analog circuits without significant degradation in performance. The elimination of external passive components and the addition of programmable interconnect structures for the circuit blocks also reduce the sensitivity of circuit designs to board-level variables and tolerances. Moreover, by removing sensitivity to an analog routing pool and facilitating internal modification of function without changing topologic sensitivity to offset and distortion, an integrated circuit can advantageously be provided with multiple programmable analog circuit blocks and an analog routing pool which can accommodate more complex analog functions.

Figure 6:
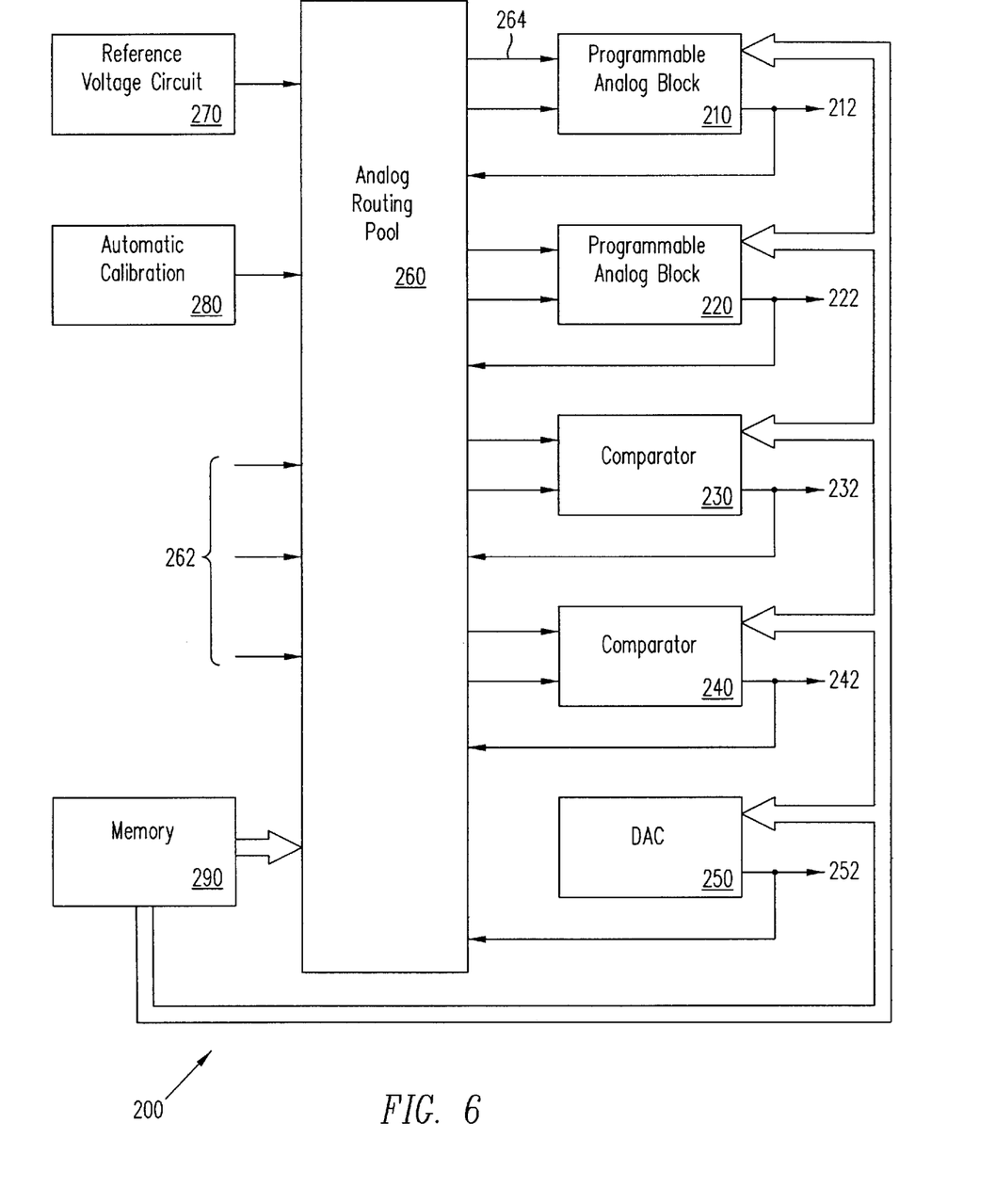
FIG. 6 is a block diagram of a programmable analog integrated circuit including the programmable transconductor of the present invention.

Referring to FIG. 6, an example of a programmable analog integrated circuit 200 includes two programmable analog circuit blocks 210 and 220, comparator blocks 230 and 240, a differential output digital-to-analog converter (DAC) 250, and an analog routing pool 260. Programmable analog integrated circuit 200 also includes support circuitry coupled to interconnect array 260, such as voltage reference circuit 270, power-on auto-calibration circuitry 280, and configuration memory 290. Differential input signals 262 are received by analog routing pool 260, and can be routed to any of programmable analog circuit blocks 210 and 220, comparator blocks 230 and 240, and external output terminals (not shown), depending upon the programming of analog routing pool 260. Analog routing pool 260 also controls the routing of the output signals of each of the programmable analog circuit blocks 210 and 220, comparator blocks 230 and 240, differential output DAC 250, and external output terminals. FIG. 6 is merely an example of a programmable analog integrated circuit that can include the programmable transconductors of the present invention, and those having ordinary skill in the art will readily recognize that a variety of different analog integrated circuits, with various functions, can be implemented.

The routing of the analog routing pool is determined by information stored in memory 290. More specifically, individual bits stored within memory 290 control whether individual switches of analog routing pool 260 are on or off. Memory 290 also stores similar information for programming the programmable analog circuit blocks 210 and 220, the comparators 230 and 240, and the differential output DAC 250. Reference voltage circuit 270 provides a stable voltage reference, e.g., 2.5 V, to analog routing pool 260 for use throughout programmable analog integrated circuit 200.

Programmable analog circuit blocks 210 and 220 can include operational amplifiers, resistors, capacitors, and other basic analog circuit elements. An example of programmable analog circuit blocks 210 and 220 is described below in conjunction with FIG. 7. In general, programmable analog circuit blocks 210 and 220 flexibly implement basic analog circuit functions such as precision filtering, summing/differencing, gain/attenuation, and integration.

Programmable analog circuit blocks 210 and 220 can be implemented as single-ended circuit blocks, although in a preferred embodiment, they are fully differential from input to output. Note that for simplicity in FIG. 6 each of the differential input signals 262, each of the two differential input signals to programmable analog circuit blocks 210 and 220, each of the two differential input signals double difference comparator blocks 230 and 240, and each of the differential output signals 212, 222, and 252 are shown as single lines, even though they each preferably represent a differential signal pair. So, for example, differential output signal 264 represents a pair of output signals, one having a positive voltage with respect to the other. Moreover, the circuits illustrated are implemented with fully differential circuit pathways in their preferred embodiments, although single-ended operation is possible by design, by programming, or via conversion circuits at the input and output nodes. Differential architecture substantially increases dynamic range as compared to single-ended I/O, while affording improved performance with regard to circuit specifications such as common mode rejection and total harmonic distortion. Differential operation affords added immunity to variations in the circuit's power supply.

Automatic calibration circuit 280 is used to calibrate circuit elements of programmable analog integrated circuit 200, such as programmable analog circuit blocks 210 and 220. Typically, a calibration mode is initiated by, for example, a circuit power on signal (i.e., anytime the circuit is turned on) or by a specific calibrate command signal that allows calibration to be requested at any time.

Comparator blocks 230 and 240 provide truly differential comparators where both inputs are differential inputs and the output is a differential output. In principle, comparators 230 and 240 operate no differently than any standard, single-ended comparator, i.e., whenever the plus (or signal) input is positive with respect to the minus (or reference) input, the comparators' logic output signal will be high, otherwise they will be low. However, with the comparators 230 and 240, both the plus and minus input terminals can receive a positive (Vin+) and a negative (Vin−) input signal, with the differential input voltage defined as [(Vin+)−(Vin−)]. Thus, the output of comparator 230 or 240 is high whenever the differential voltage on the plus input is positive with respect to the differential input voltage on the minus input.

In many applications it is desirable to compare a signal to a known reference. This can be accomplished with programmable analog integrated circuit 200 in a variety of ways. For example, a reference signal can be coupled to one of the differential inputs 262, and subsequently routed to one or both of the comparators 230 and 240 via analog routing pool 260. Similarly, a differential output signal from one of the programmable analog circuit blocks 210 and 220 can be routed to one or both of the double difference comparators 230 and 240 via analog routing pool 260. Finally, differential output DAC 250 can be programmed to produce a differential analog signal that is routed to one or both of the double difference comparators 230 and 240 via analog routing pool 260.

Figure 7:
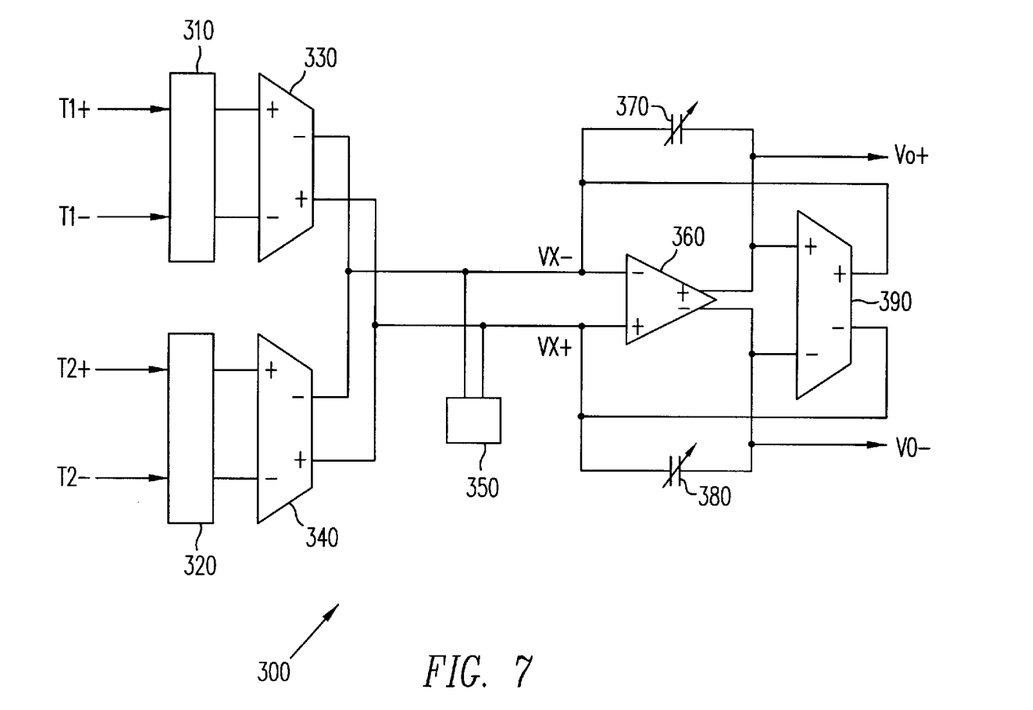
FIG. 7 is a simplified schematic diagram of a programmable analog circuit block such as the programmable analog circuit blocks shown in FIG. 6.

FIG. 7 is a simplified schematic diagram of a programmable analog circuit 300, such as programmable analog circuit block 210 and 220. Programmable analog circuit 300 includes polarity control circuits 310 and 320, input transconductors 330 and 340, terminator circuit 350, differential amplifier 360, programmable capacitor arrays 370 and 380, and feedback transconductor 390. Programmable analog circuit 300 is typically programmed using information stored within a memory, such as memory 290 of FIG. 6. In general, any of transconductors 330, 340, and 390 can be based on the improved programmable transconductor designs discussed above.

Programmable capacitor arrays 370 and 380 are used to add or eliminate capacitance from programmable analog circuit 300. Each programmable capacitor array 370, 380 includes integrated capacitors and a plurality of MOS switches controlling which, if any, integrated capacitor is active within programmable analog circuit 300. Capacitors that are not active within the capacitor array are automatically connected to the reference voltage, thereby eliminating the capacitors from any circuit interaction.

FIG. 7 is merely illustrative of some of the features and programmability of an example of a programmable analog integrated circuit, and those having ordinary skill in the are will readily recognize different configurations and programmability options to achieve different analog circuit applications.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A programmable transconductor for generating a differential current between first and second current output terminals responsive to a differential voltage applied between first and second voltage input terminals, comprising:

a first summing node;

a first feedback node;

a second summing node;

a second feedback node;

a resistor circuit including a plurality of resistors connected in series and defining a plurality of intermediate nodes, respective ones of the plurality of intermediate nodes being located between adjacent resistors of the plurality of resistors, wherein the programmable transconductor is configured to selectively couple at least one of the plurality of resistors between the first summing node and the second summing node and to leave remaining ones of the plurality of resistors uncoupled from the first summing node and the second summing node;

a switch circuit coupled between a first one of the plurality of intermediate nodes and one of: the first summing node and the second summing node;

a first input circuit, coupled to the first summing node and the first voltage input terminal, the first input circuit biasing the first summing node to a suitable voltage so as to bias the first feedback node to a voltage substantially equal to a voltage applied to the first voltage input terminal; and a second input circuit, coupled to the second summing node and the second voltage input terminal, the second input circuit biasing the second summing node to a suitable voltage so as to bias the second feedback node to a voltage substantially equal to a voltage applied to the second voltage input terminal.

2. The programmable transconductor of claim 1 wherein the switch circuit is used to selectively couple the at least one of the plurality of resistors between the first summing node and the second summing node.

3. The programmable transconductor of claim 1 wherein the switch circuit further comprises:

a first plurality of switch circuits, each having a first terminal coupled to a corresponding intermediate node of the resistor circuit, and each further having a second terminal coupled to the first summing node; and a second plurality of switch circuits, each having a first terminal coupled to a corresponding intermediate node of the resistor circuit, and each further having a second terminal coupled to the second summing node.

4. The programmable transconductor of claim 3 wherein the plurality of resistors comprises:

a first group of resistors connected in series and defining a first group of intermediate nodes associated therewith;

a second group of resistors connected in series and defining a second group of intermediate nodes associated therewith; and a middle resistor coupled between the first group and the second group, wherein each of the first plurality of switch circuits is respectively coupled to each of the first group of intermediate nodes, and each of the second plurality of switch circuits is respectively coupled to each of the second group of intermediate nodes.

5. The programmable transconductor of claim 4 wherein the first and second groups of resistors are balanced.

6. The programmable transconductor of claim 1 further comprising:

a second switch circuit coupled between the first one of the plurality of intermediate nodes and one of: the first feedback node and the second feedback node.

7. The programmable transconductor of claim 6 wherein the second switch circuit is operable to selectively couple at least one of the plurality of resistors between the first feedback node and the second feedback node and to leave remaining ones of the plurality of resistors uncoupled from the first feedback node and the second feedback node.

8. The programmable transconductor of claim 6 wherein the second switch circuit further comprises:

a first plurality of switch circuits, each having a first terminal coupled to a corresponding intermediate node of the resistor circuit, and each further having a second terminal coupled to the first feedback node; and a second plurality of switch circuits, each having a first terminal coupled to a corresponding intermediate node of the resistor circuit, and each further having a second terminal coupled to the second feedback node.

9. The programmable transconductor of claim 1 further comprising:
a current source circuit configured to deliver a current to each of the first summing node and the second summing node.

10. The programmable transconductor of claim 9 wherein the current source circuit further comprises:
a first current source circuit configured to deliver a first current to the first summing node; and
a second current source circuit configured to deliver a second current to the second summing node.

11. The programmable transconductor of claim 9 wherein the current source circuit is configured to deliver substantially the same current to each of the first summing node and the second summing node.

12. The programmable transconductor of claim 1 wherein the first input circuit comprises:
a first gain block having a first input coupled to the first voltage input terminal, a second input coupled to the first feedback node, and an output; and
a first transistor having a first current-handling terminal coupled to the first summing node, a second current-handling terminal coupled to the first current output terminal, and a control terminal coupled to the output of the first gain block.

13. The programmable transconductor of claim 12 wherein the second input circuit comprises:
a second gain block having a first input coupled to the second voltage input terminal, a second input coupled to the second feedback node, and an output; and
a second transistor having a first current-handling terminal coupled to the second summing node, a second current-handling terminal coupled to the second current output terminal, and a control terminal coupled to the output of the second gain block.

14. The programmable transconductor of claim 12 wherein the first input of the first gain block is a non-inverting input, and wherein the second input of the first gain block is an inverting input.

15. The programmable transconductor of claim 12 wherein the first transistor is a transistor chosen from the group consisting of P channel MOS transistors, N-channel MOS transistors, PNP bipolar transistors, and NPN bipolar transistors.

16. The programmable transconductor of claim 12 wherein the first gain block is an operational amplifier (op-amp).

17. The programmable transconductor of claim 1 wherein the switch circuit comprises a CMOS transfer gate circuit.

18. The programmable transconductor of claim 1 wherein the switch circuit is enabled by a control signal.

19. The programmable transconductor of claim 1 further comprising a memory circuit coupled to the switch circuit, the memory circuit operable to supply a control signal to the switch circuit.

20. The programmable transconductor of claim 19 wherein the memory circuit is a nonvolatile memory circuit.

21. The programmable transconductor of claim 1 wherein the
a first summing node is coupled to the first feedback node; and
a second summing node is coupled to the second feedback node.

22. A programmable analog integrated circuit for receiving a differential analog input signal and providing a processed differential analog output signal, the programmable analog circuit comprising:
a first programmable analog circuit block, the first programmable analog circuit block having first analog circuit block positive and negative input terminals and first analog circuit block positive and negative output terminals, and including:
a programmable transconductor for generating a differential current between first and second current output terminals responsive to a differential voltage applied between first and second voltage input terminals, comprising:
a first summing node;
a first feedback node;
a second summing node;
a second feedback node;
a resistor circuit including a plurality of resistors connected in series and defining a plurality of intermediate nodes, respective ones of the plurality of intermediate nodes being located between adjacent resistors of the plurality of resistors, wherein the programmable transconductor is configured to selectively couple at least one of the plurality of resistors between the first summing node and the second summing node and to leave remaining ones of the plurality of resistors uncoupled from the first summing node and the second summing node;
a switch circuit coupled between a first one of the plurality of intermediate nodes and one of: the first summing node and the second summing node;
a first input circuit, coupled to the first summing node and the first voltage input terminal, the first input circuit biasing the first summing node to a suitable voltage so as to bias the first feedback node to a voltage substantially equal to a voltage applied to the first voltage input terminal; and
a second input circuit, coupled to the second summing node and the second voltage input terminal, the second input circuit biasing the second summing node to a suitable voltage so as to bias the second feedback node to a voltage substantially equal to a voltage applied to the second voltage input terminal; and
an analog routing pool, the analog routing pool controlling the routing of the differential analog input signal and signals provided by and to the first programmable analog circuit block, the analog routing pool being programmable.

23. The programmable analog integrated circuit of claim 22 further comprising:
a memory coupled to the analog routing pool, the memory storing information for use in programming the analog routing pool.

24. The programmable analog integrated circuit of claim 23, wherein the memory is a nonvolatile memory.

25. The programmable analog integrated circuit of claim 22 wherein the switch circuit is used to selectively couple the at least one of the plurality of resistors between the first summing node and the second summing node.

26. The programmable analog integrated circuit of claim 22 wherein the switch circuit further comprises:
a first plurality of switch circuits, each having a first terminal coupled to a corresponding intermediate node of the resistor circuit, and each further having a second terminal coupled to the first summing node; and
a second plurality of switch circuits, each having a first terminal coupled to a corresponding intermediate node of the resistor circuit, and each further having a second terminal coupled to the second summing node.

27. The programmable analog integrated circuit of claim 22 wherein the programmable transconductor further comprises:
   a second switch circuit coupled between the first one of the plurality of intermediate nodes and one of: the first feedback node and the second feedback node.

28. The programmable analog integrated circuit of claim 27 wherein the second switch circuit is operable to selectively couple at least one of the plurality of resistors between the first feedback node and the second feedback node and to leave remaining ones of the plurality of resistors uncoupled from the first feedback node and the second feedback node.

29. The programmable analog integrated circuit of claim 27 wherein the second switch circuit further comprises:
   a first plurality of switch circuits, each having a first terminal coupled to a corresponding intermediate node of the resistor circuit, and each further having a second terminal coupled to the first feedback node; and
   a second plurality of switch circuits, each having a first terminal coupled to a corresponding intermediate node of the resistor circuit, and each further having a second terminal coupled to the second feedback node.

30. The programmable analog integrated circuit of claim 22 wherein the programmable transconductor further comprises:
   a current source circuit configured to deliver a current to each of the first summing node and the second summing node.

31. The programmable analog integrated circuit of claim 22 wherein the first input circuit comprises:
   a first gain block having a first input coupled to the first voltage input terminal, a second input coupled to the first feedback node, and an output; and
   a first transistor having a first current-handling terminal coupled to the first summing node, a second current-handling terminal coupled to the first current output terminal, and a control terminal coupled to the output of the first gain block.

32. The programmable analog integrated circuit of claim 22 wherein the switch circuit comprises a CMOS transfer gate circuit.

33. The programmable analog integrated circuit of claim 22 wherein the programmable transconductor further comprises a memory circuit coupled to the switch circuit, the memory circuit operable to supply a control signal to the switch circuit.

34. The programmable analog integrated circuit of claim 22 wherein the
   a first summing node is coupled to the first feedback node; and
   a second summing node is coupled to the second feedback node.

35. A programmable transconductor for generating a differential current between first and second current output terminals responsive to a differential voltage applied between first and second voltage input terminals, comprising:
   a first summing node;
   a first feedback node;
   a second summing node;
   a second feedback node;
   a current source circuit configured to deliver a current to each of the first summing node and the second summing node;
   a resistor circuit including a plurality of resistors connected in series and defining a plurality of intermediate nodes, respective ones of the plurality of intermediate nodes being located between adjacent resistors of the plurality of resistors, wherein the programmable transconductor is configured to selectively couple at least one of the plurality of resistors between the first summing node and the second summing node and to leave remaining ones of the plurality of resistors uncoupled from the first summing node and the second summing node;
   a first plurality of switch circuits, each having a first terminal coupled to a corresponding intermediate node of the resistor circuit, and each further having a second terminal coupled to the first summing node;
   a second plurality of switch circuits, each having a first terminal coupled to a corresponding intermediate node of the resistor circuit, and each further having a second terminal coupled to the second summing node;
   a third plurality of switch circuits, each having a first terminal coupled to a corresponding intermediate node of the resistor circuit, and each further having a second terminal coupled to the first feedback node;
   a fourth plurality of switch circuits, each having a first terminal coupled to a corresponding intermediate node of the resistor circuit, and each further having a second terminal coupled to the second feedback node;
   a first gain block having a first input coupled to the first voltage input terminal, a second input coupled to the first feedback node, and an output;
   a first transistor having a first current-handling terminal coupled to the first summing node, a second current-handling terminal coupled to the first current output terminal, and a control terminal coupled to the output of the first gain block;
   a second gain block having a first input coupled to the second voltage input terminal, a second input coupled to the second feedback node, and an output; and
   a second transistor having a first current-handling terminal coupled to the second summing node, a second current-handling terminal coupled to the second current output terminal, and a control terminal coupled to the output of the second gain block.

36. The programmable transconductor of claim 35 wherein the plurality of resistors comprises:
   a first group of resistors connected in series and defining a first group of intermediate nodes associated therewith;
   a second group of resistors connected in series and defining a second group of intermediate nodes associated therewith; and
   a middle resistor coupled between the first group and the second group, wherein each of the first plurality of switch circuits is respectively coupled to each of the first group of intermediate nodes, and each of the second plurality of switch circuits is respectively coupled to each of the second group of intermediate nodes.

37. The programmable transconductor of claim 36 wherein the first and second groups of resistors are balanced.

38. The programmable transconductor of claim 35 wherein the current source circuit further comprises:

a first current source circuit configured to deliver a first current to the first summing node; and a second current source circuit configured to deliver a second current to the second summing node.

39. The programmable transconductor of claim 38 wherein the current source circuit is configured to deliver substantially the same current to each of the first summing node and the second summing node.

40. The programmable transconductor of claim 35 wherein at least one of the first transistor and the second transistor is a transistor chosen from the group consisting of P channel MOS transistors, N-channel MOS transistors, PNP bipolar transistors, and NPN bipolar transistors.

41. The programmable transconductor of claim 35 wherein the at least one of the first gain block and the second gain block is an operational amplifier (op-amp).

42. The programmable transconductor of claim 35 wherein at least one of the first, second, third, and fourth plurality of switch circuits comprises a CMOS transfer gate circuit.

43. The programmable transconductor of claim 35 wherein at least one of the first, second, third, and fourth plurality of switch circuits is enabled by a control signal.

44. The programmable transconductor of claim 35 further comprising a memory circuit coupled to at least one of the first, second, third, and fourth plurality of switch circuits, the memory circuit operable to supply at least one switch circuit control signal.

45. The programmable transconductor of claim 44 wherein the memory circuit is a nonvolatile memory circuit.

* * * * *